United States Patent [19]
Jha et al.

[11] Patent Number: 5,310,520
[45] Date of Patent: May 10, 1994

[54] CIRCUIT SYSTEM, A COMPOSITE MATERIAL FOR USE THEREIN, AND A METHOD OF MAKING THE MATERIAL

[75] Inventors: Sunil C. Jha, Attleboro, Mass.; James A. Forster, Barrington, R.I.; Henry F. Breit, Attleboro, Mass.

[73] Assignee: Texas Instruments Incorporated, Dallas, Tex.

[21] Appl. No.: 10,931

[22] Filed: Jan. 29, 1993

[51] Int. Cl.⁵ .............................. B22F 1/00; B22F 3/14
[52] U.S. Cl. ........................................ 419/48; 419/31; 419/39; 419/44; 419/26; 419/60; 419/67
[58] Field of Search ............ 419/66, 67, 5, 6, 31, 419/32, 38, 41, 48; 75/246, 247, 249; 148/527, 529; 228/248; 437/902; 473/3

[56] References Cited

U.S. PATENT DOCUMENTS

| | | | |
|---|---|---|---|
| 3,097,329 | 7/1963 | Siemens | 317/234 |
| 3,399,332 | 8/1968 | Savolainen | 317/234 |
| 4,099,318 | 7/1978 | Cooper et al. | 29/578 |
| 4,158,719 | 6/1979 | Frantz | 428/567 |
| 4,283,464 | 8/1981 | Hascoe | 428/594 |
| 4,472,762 | 9/1984 | Spinelli et al. | 361/386 |
| 4,743,317 | 5/1988 | Skinner et al. | 148/437 |
| 4,818,481 | 4/1989 | Luton et al. | 419/67 |
| 4,836,979 | 6/1989 | Bell et al. | 419/22 |
| 4,894,293 | 1/1990 | Breit et al. | 428/614 |
| 4,996,115 | 2/1991 | Erkes et al. | 428/614 |
| 5,049,184 | 9/1991 | Harner et al. | 75/246 |
| 5,059,543 | 10/1991 | Wise et al. | 437/3 |
| 5,151,777 | 9/1992 | Akin et al. | 357/81 |
| 5,152,959 | 10/1992 | Scorey | 419/66 |

*Primary Examiner*—Donald P. Walsh
*Assistant Examiner*—John N. Greaves
*Attorney, Agent, or Firm*—Russell E. Baumann; Richard L. Donaldson; Rene' E. Grossman

[57] ABSTRACT

Discrete powder particles of copper 14 and INVAR 12 are mixed together in a container 16 and packed into a powder metal article. This article is hot vacuum degassed and vacuum sealed and then heated to temperature well below the sintering temperature of copper or INVAR. Immediately after heating the article, it is subjected to a high pressure, high strain force such as extrusion through a die thereby yielding a fully dense, strong composite material 10 with excellent combined thermal expansion and conductivity properties.

13 Claims, 2 Drawing Sheets

CIRCUIT SYSTEM, A COMPOSITE MATERIAL FOR USE THEREIN, AND A METHOD OF MAKING THE MATERIAL

BACKGROUND OF THE INVENTION

This invention relates to a composite material for thermal management and method of manufacture and more particularly to the material and method for producing a composite metal material for use in mounting semiconducting devices in electronic circuit systems.

Conventional electronic systems employ a variety of circuit board substrates and the like for mounting semiconductor devices such as integrated circuit chips and the like. In such systems, it is know to be desirable to provide substrate materials which have coefficients of thermal expansion corresponding to those of the semiconductor devices to be mounted thereon, whereby the semiconductor devices can remain securely mounted and electrically connected to circuit on the substrates during thermal cycling of the systems. It is also known to be desirable to provide substrate materials with substantial thermal conductivity properties for dissipating heat from the semiconductor devices during operation of the devices, thereby to improve operating and reliability characteristics of the devices and systems. It is also known to employ composite metal materials in such substrates to combine relatively low coefficient of thermal expansion characteristics of one metal material with relatively high thermal conductivity characteristics of another metal material, thereby to provide composite materials having desirable combinations of coefficient of expansion and thermal conductivity properties.

For example, U.S. Pat. No. 4,894,293 provides for taking a plurality of discrete particles of a ferrous metal alloy having a relatively low coefficient of thermal expansion and coating them with a copper material having a relatively high thermal conductivity. These coated particles are then mixed with pure copper particles and pressed together and heated to provide for diffusion bonding of the particles together to form a continuous copper matrix with the discrete ferrous particles contained therein.

U.S. Pat. No. 3,399,332 provides a grid of a metal material of relatively low coefficient of thermal expansion having openings in the grid filled with a copper material or the like of relatively higher thermal conductivity to provide a mounting for a semiconductor device having a desired combination of thermal expansion and conductivity properties. In another embodiment, the patent suggests that particles of a ferrous alloy can be impregnated into a copper material for providing an alternate material having selected thermal expansion and conductivity properties. U.S. Pat. No. 4,283,464 provides two grids of a metal material of relatively low coefficient of thermal expansion on either side of an inner layer of copper metal for providing a composite substrate material having another described combination of thermal expansion and conductivity properties. U.S. Pat. No. 4,472,672 shows layer combinations of ferrous metal materials of relatively low thermal expansion properties with layer materials of relatively high thermal conductivity where the layer thicknesses are regulated to be within selected ranges for providing composite metal materials with coefficients of thermal expansion substantially corresponding to those of semiconductor devices to be mounted thereon. U.S. Pat. Nos. 3,097,329 and 4,158,719 show composite metal materials formed by powder metallurgy techniques or the like either by compacting mixtures of metal powders of relatively low coefficient of thermal expansion with metal powders of relatively high thermal conductivity materials and then heating the compacted powders for diffusion bonding the particles to each other or by compacting and sintering one of the metal powders to form a porous sintered compact and by then filling the pores of that sintered compact with a melt of the other metal material.

However, each of such previously known composite metal substrate materials has been subject to some objection. Thus, the composite metal materials shown in U.S. Pat. Nos. 4,894,293, 3,097,329 and 4,158,719 are not found to consistently and economically provide desirable combinations of thermal expansion and conductivity properties because of the manner in which they are made; the composite metal materials shown in U.S. Pat. Nos. 3,399,332 and 4,283,464 are difficult to manufacture and to apply to specific circuit system applications; and the composite metal material shown in U.S. Pat. No. 4,472,762 does not provide desirably high thermal conductivity in all directions.

Lastly, composite powdered metal systems such as copper tungsten, copper molybdenum and silver invar can provide good thermal conductivity and thermal expansion characteristics; but such combinations are expensive to produce, and in the case of copper tungsten and copper molybdenum, difficult to machine and electroplate.

BRIEF SUMMARY OF THE INVENTION

Accordingly, the present invention provides for a powder metal composite material and method of manufacture typically for a thermal management material in a semiconductor circuit system which is capable of being formed in various shapes, and having a superior combination of thermal expansion and conductivity properties. Further, the composite material is easily and economically manufactured while being characterized by good strength, machinability and electroplatability.

Briefly described, in accordance with the invention, a plurality of discrete particles of a ferrous metal alloy having a relatively low coefficient of thermal expansion are mixed with a plurality of discrete particles of a metal having a relatively high thermal conductivity and packed together in accordance with conventional powder metallurgy techniques, preferably forming an article having a porosity of less than about 40% or the like. These packed particles are then heated below the sintering temperature for them and subjected to a high pressure imparting high strain to them for a short duration of time such as an extrusion process having an area reduction ratio of about 8 to 1 or greater. This processing yields a completely dense composite material with excellent combined thermal expansion and conductivity properties and good strength capable of being economically produced in various shapes and which is readily platable and machinable. The relative ratio of these starting materials will provide the predictable composite material with needed thermal expansion and conductivity properties. The high strain exerted upon the particles causes the formation of a strong bond between them and a fully dense material. The fact that any heating of the combined particles is below the sintering temperature provides that no real diffusion of ferrous, nickelous or other materials from the low coefficient of thermal expansion component diffuse into the high conductivity material component to greatly reduce the conductivity of said high conductivity component and, thus, the composite. Further, this process works well with a copper and nickel/iron system which is economical, machinable and easy to plate.

DESCRIPTION OF THE DRAWINGS

Other objects, advantages and details of the novel composite metal material and method of this invention appear in the following detailed description of preferred embodiments of the invention, the detailed description referring to the drawings in which.

DESCRIPTION OF THE PREFERRED EMBODIMENTS

Figure 1:
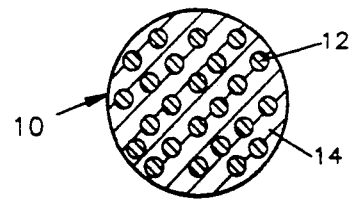
FIG. 1 shows a cross-sectional view of a composite material made in accordance with this invention.

Referring to the drawings, a composite material 10 in accordance with the invention comprises a mixture of metal powders, the first metal powder 12 of a low thermal expansivity and a second metal powder 14 of a high thermal conductivity. The selection of the low-expansivity metal and proportion in the final composite 10 depends in part to the expansivity of the high conductivity metal used in the composite and also on the desired expansivity in the final composite article. Typically, a low expansivity metal suitable for use in this invention should have a thermal expansion coefficient of less than about 10 ppm/°C. at room temperature. A class of alloys which provides the desired expansion coefficients for the low-expansivity metal are the iron-nickel and iron-nickel-cobalt controlled expansion alloys. The predominant elements of these alloys are iron and nickel which coact to provide an austenitic microstructure, in which the cobalt may be substituted for some of the nickel. A preferred composition for alloys of this type comprises, in weight percent (w/o), about 45 to 70% iron, about 20 to 55% nickel, up to 25% cobalt and up to about 5% chromium, which is balanced to provide an alloy with desired low expansivity. A typical choice of material is INVAR, an alloy containing about 36% nickel, balance essentially iron, together with usual amounts of impurities and incidental elements.

The high thermal conductivity material for use in this invention has an electrical/thermal conductivity ranging from about 60 to 105% of pure copper (thermal and electrical conductivity values for these high conductivity metals are directly proportional to one another and electrical conductivity values will be used throughout). The suitable high conductivity metals which are preferred for use in this invention are substantially elemental copper or aluminum (at least 99% pure) and high copper/silver alloys. A number of other elemental metals such as silver, gold, and platinum also have suitable conductivities but are considered to be too expensive for general use.

Metal powders 12 and 14 in accordance with this invention are produced by standard techniques such as electrochemically produced copper powder and gas atomized iron-nickel alloyed powder. These powders of a size typically between 44 and 425 microns (although other sizes could be used) are blended together to get a homogenous mixture which is packed to form a powder article having a porosity of about less than 40%. This powder article is heated to a temperature below the sintering temperatures of its constituents 12 and 14 and subjected to a high pressure, rapid consolidation of the particles to provide an essentially 100% dense article which has essentially no interdiffusion between the metal constituents of the article while still providing a strong article which does not need a post compaction sintering operation. As used herein, the sintering temperature is the temperature equal to 75% to 80% of the absolute melting temperature of the lower melting point component of the composite material. It is the high pressure, rapid consolidation with the resulting high strain imparted to the powder materials which causes strong bonding between the particles and yields a 100% dense article. That is, the high strain on the individual particles causes stretching and elongation of them creating nascent surfaces which more readily bond to one another. Equally important, the high pressure, rapid consolidation has shown to alleviate the need for a post bonding sintering step in order to obtain a 100% dense and strong article. This fact is important because the diffusion associated with sintering greatly reduces the conductivity of the resulting composite article. Also, any heating of the powder/composite material should be as rapid as possible.

Figure 4:
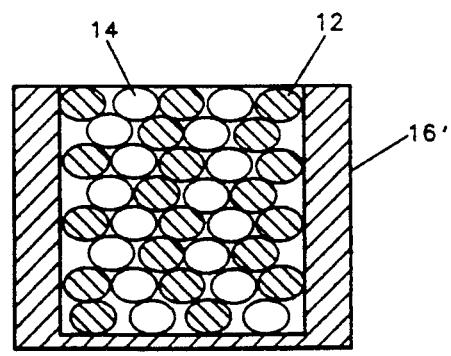
FIG. 4 shows a cross-sectional view of a modified container with metal powders contained therein.
Figure 5:
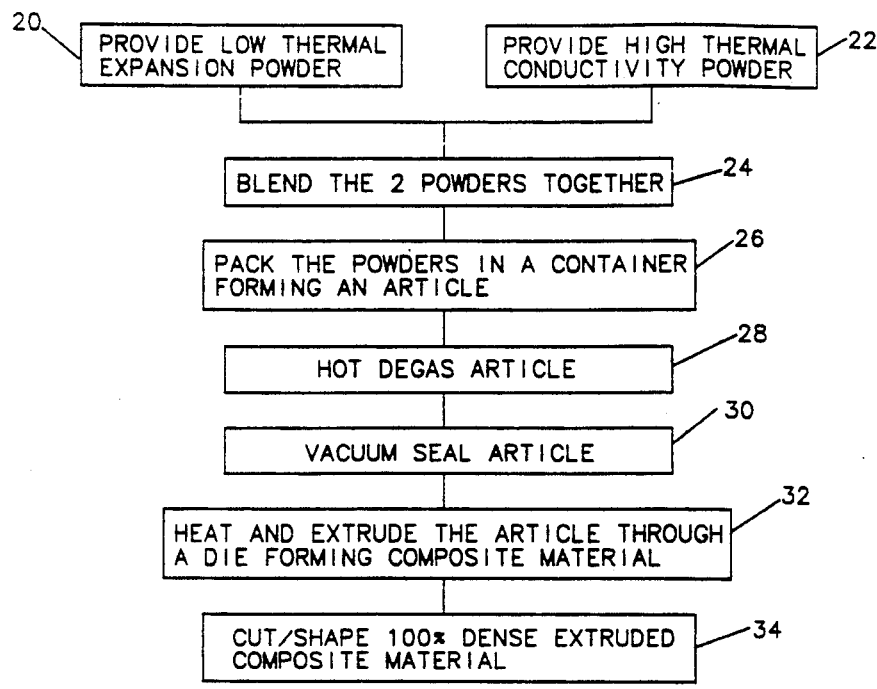
FIG. 5 is a flow diagram showing the main processing steps in making the FIG. 1 material.

With reference to a preferred embodiment of this invention (see FIG. 4) the final composite material 10 is made from first metal power 12 (20, FIG. 4) of a low thermal expansivity such as INVAR and second metal powder 14 (22, FIG. 4) of a high thermal conductivity such as essentially pure copper. A typical mixture ratio for component 10 is 40 volume percent copper and 60 volume percent Invar with a powder size for both powders of approximately 300 microns or less. It is to be understood, however, that other ratios can be used in which the copper (high conductivity constituent) can vary from 10 volume percent to 60 volume percent with the balance being INVAR (low thermal expansivity constituent). These powders are blended in a standard V-blender or the like to provide a homogenous mixture (24, FIG. 4) and then poured (24, FIG. 4) in a container 16 (see FIG. 2). This mixture is packed (26, FIG. 4) by tapping, or the like, preferably to densify the powders to a density of greater than 60% as compared to theoretical density although lesser densities could be used. The powder article (container with packed powders) is preferably sealed and evacuated (30, FIG. 4) and then heated to a temperature of between 250° F. and 500° F. for a period of about 30 minutes to remove any moisture and absorbed vaporable impurities yielding a final vacuum level of $10^{-4}$ Torr or better. The vacuum sealed container 16 is then heated again at a temperature well below that of the sintering temperature of the powders, typically about 1200° F., for sufficient time to assure uniform temperature of the article typically one hour or less and then extruded (32, FIG. 4) through a die in a high tonnage direct extrusion press with an extrusion reduction ratio of greater than 8 to 1 and typically about 16 to 1, with an extrusion ram speed ranging typically from 1 to 10 feet per minute. This extrusion process of the powder imparts a high true strain on the article (individual particles) in the range of 1.75 to 3 and thus yields a fully dense composite material with strong inter-particle strength so that a post sintering operation would not be needed. If desired, the extruded material can be stress relieved at a temperature between 800° F. to 1000° F. for from typically 1 minute to 30 minutes. This stress relieving operation is once again well below the sintering temperature of the powders and does not provide for diffusion between the two powder constituents. The final extruded composite material can be cut or otherwise formed (34, FIG. 4) into the desired shape for use as a heat sink or the like in an electronic circuit system.

Figure 2:
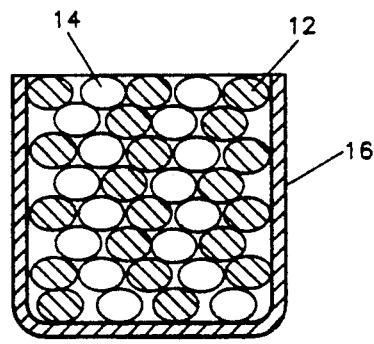
FIG. 2 shows a cross-section view of container with metal powders contained therein.
Figure 3:
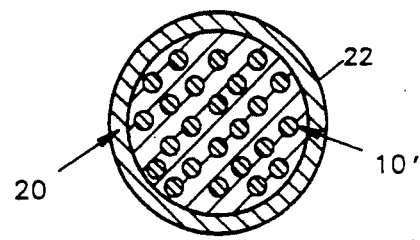
FIG. 3 shows a cross-section view of a composite material in accordance with another embodiment of this invention.
Figure 7:
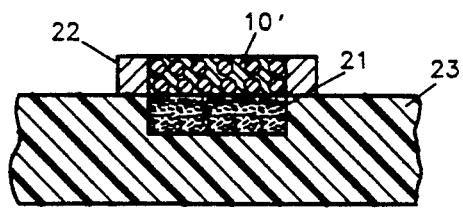
FIG. 7 is a section view showing the composite material of FIG. 3 in an electronic circuit.

In another embodiment of this invention, a fully dense composite article with selected thermal coefficient expansion and thermal conductivity properties forms the core 10' of a final combination product 20 which includes an outer coating 22 of a material such as copper as shown in FIG. 3. One convenient manner to make such a material is to replace the standard container 16, as shown in FIG. 2, with a heavy wall container 16' (see FIG. 4) made from a material such as copper so that the final composite extruded article has the solid outer coating of the material of the container. The ratio of the container wall thickness area to the overall area of the container with particles can be typically between 2 and 30 percent. It is to be understood that other methods are available such as brazing, force fitting, etc., for providing an outer layer around the core 10'. This material combination 20 is especially useful in applications (see FIG. 7) where the core portion 10' is joined to a semiconductor device by conventional means and outer coating 22 is contacted by a package encapsulation material 23 such as plastic. Each of the parts of the material combination has a coefficient of thermal expansion to better match with the materials they are contacting (i.e., semiconductor material and plastic).

In order to give greater appreciation of the advantages of the invention, the following examples are given:

EXAMPLE I

Elemental copper powder (−100 mesh) was blended with INVAR powder (−100 mesh) in a V-blender in a ratio of 40 volume percent copper and 60 volume percent INVAR. The blended powder mixture was poured into a two inch diameter copper container of 1/16 inch wall thickness (extrusion can) filling the container. The blended powder was packed by tapping to a density of approximately sixty percent. The container was then sealed and evacuated and heated to about 300° F. to hot vacuum degas and then the container was totally vacuum sealed with a vacuum level of $1 \times 10^{-5}$ Torr. Next, the sealed container was heated to 1200° F. for one hour, and then immediately extruded through a ½ inch diameter circular die in a standard 300 ton direct extrusion press with an extrusion ram speed of 45 inches per minute to yield a fully dense circular rod. If desired, the rod can have any surface layer removed by appropriate etching or abrading.

The composite material had the following properties:

| 1. Density | 8.4 gm/cc |
| --- | --- |
| 2. TCE (ppm/°C.) | 7.3 |
| 3. Thermal Conductivity (watts/M.K.) | 126.0 |
| 4. Electrical Conductivity (IACS) | 35% |

EXAMPLE II

Copper powder was blended with INVAR powder in a V-blender in the same ratio as in Example I and processed identically except a 4 inch diameter container was used and the extrusion was done with a 1400 ton press through an one inch diameter die.

The composite material had the following properties:

| 1. Density | 8.4 gm/cc |
| --- | --- |
| 2. TCE (ppm/C.) | 6.8 |
| 3. Thermal Conductivity (watts/M.K.) | 120.0 |
| 4. Electrical Conductivity (IACS) | 35% |

EXAMPLE III

This example was carried out identical to Example I above except that after forming the circular rod, the rod was further heated to 1650° F. for 20 minutes (sintering operation). After this heating the electrical conductivity was 15% (IACS).

EXAMPLE IV

This example was carried out identical to Example I above except that after forming the rod, the rod was further heated to 950° F. for 20 minutes (stress relieving anneal below sintering temperature). After this heating the electrical conductivity was 35% (IACS).

Thus, comparing the results of the electrical conductivity, of Examples III and IV clearly shows the problem that takes place if there is diffusion of the two components into one another which was practiced in the prior art to obtain the desired strength and density of the composite. Hot roll compaction has also not proven to provide for the fully dense, strong article due to the fact that the true strain values in this processing operation are not significantly high (less than 1.5). The present invention with the rapid, high true strain, high pressure consolidation as by extrusion provides for the novel composite material with greatly enhanced properties. Further, since there is no real diffusion between the individual particles of the composite material, it is possible to preferentially etch one of the constituents thereby leaving a porous surface layer. This porous surface layer can be very beneficial in improving adhesion to other materials as part of an encapsulation process with a plastic or the like when the composite is used in certain electronic device applications. Also, the use of the outer coating material 22 of FIG. 3 would be beneficial in these applications for enhanced thermal expansion matching to plastic encapsulants 23.

Figure 6:
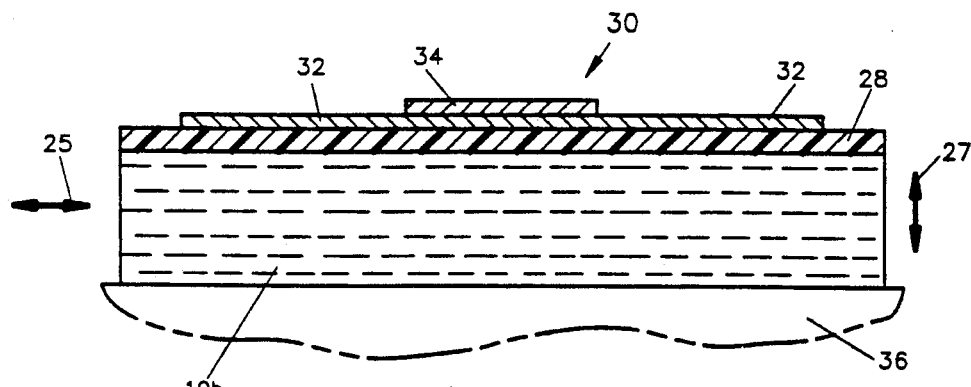
FIG. 6 is a section view showing the composite material of FIG. 1 in an electronic circuit.

The composite material 10 provided by the process of the invention is thus adapted to be used as a heat-transferring composite material for an electronic circuit to withdraw and dissipate heat from the circuit. For example, the composite material 10b is provided with a thin insulating coating 28 provided on one side of the composite and has an electronic circuit 30 diagrammatically indicated by circuit paths 32 and circuit components 34 in FIG. 6 mounted on the insulating coating. The substrate 10b is adapted to withdraw heat from the circuit through the thin insulating coating 28 to distribute that heat throughout the substrate as indicated by the arrow 25 and transfer that heat to a support 36 or the like as indicated by the arrow 27. The composite material is also adapted for use in lead frame, pin grid array devices, etc.

The novel article and method of the present invention provides for a composite material with high strength and improved combination of coefficient of expansion and thermal conductivity properties while still being economical to produce and easily machinable and able to be plated. While the invention has been described in combination with the specific embodiments thereof, it is evident that many alternatives, modifications, and variations will be apparent to those skilled in the art in light of the foregoing description such as rapid compaction by forging or by explosive compaction to achieve the rapid high pressure, high true strain consolidation yielding a fully dense material.

We claim:

1. A method for making a thermal composite material for use in electronic circuit systems comprising:
   a) providing a first powder metal material of a low coefficient of thermal expansion;
   b) providing a second powder metal material of a high thermal conductivity;
   c) mixing said first powder material with said second powder material;
   d) packing said mixture into an article;
   e) heating said article to a temperature below the sintering temperature for either said first powder metal material or said second powder metal material for sufficient time to have uniform temperature throughout the article; and
   f) immediately subjecting said heated article to extrusion through a die having an area reduction ratio of at least 8 to 1 so as to impart a true strain to said compacted article of greater than 1.75, thereby yielding a fully dense composite material with excellent combined thermal expansion and conductivity properties.

2. The method of claim 1 wherein said first powder metal material of a low coefficient of thermal expansion is an iron-nickel alloy.

3. The method of claim 1 wherein second powder metal material of a high thermal conductivity is selected from the group consisting of essentially pure copper, essentially pure aluminum and high copper-silver alloys.

4. The method of claim 1 wherein said packing of said first and second powder materials is done in a container yielding a article having a density of at least 50% of theoretical density.

5. The method of claim 1 further including the step of hot vacuum degassing and sealing said article to a vacuum level of about at least $10^{-4}$ Torr prior to heating said article to a temperature below the sintering temperature of either said first powder metal material or said second powder metal material.

6. A method of making a thermal management composite material for use in electronic circuit systems comprising:
   a) providing a first iron-nickel alloy powder metal material of a low coefficient of thermal expansion;
   b) providing a second powder metal material of a high thermal conductivity;
   c) mixing said first and second powder materials to yield a homogeneous mixture;
   d) packing said homogeneous mixture in a container into an article having a porosity of less than 50 percent;
   e) hot vacuum degassing and sealing said article;
   f) heating said article to a temperature below the sintering temperature for either said first powder metal material or said second powder metal material for sufficient time to have uniform temperature throughout the article; and
   g) immediately extruding said heated article through a die having a reduction ratio of at least 8 to 1 so as to impart a true strain to said compacted article of greater than 1.75 with an extrusion ram speed of at least 1 foot per minute thereby yielding a fully dense composite material with excellent combined thermal expansion and conductivity properties.

7. The method of claim 6 wherein said extruding of said heated article imparts a true strain to said article of greater than 1.75.

8. A method of making a thermal management composite material for use in electronic circuit systems comprising:
   a) providing a first iron-nickel alloy powder metal material of a low coefficient of thermal expansion;
   b) providing a second powder metal material of a high thermal conductivity;
   c) mixing said first and second powder materials to yield a homogeneous mixture;
   d) packing said homogeneous mixture in a container into an article having a porosity of less than 50 percent;
   e) hot vacuum degassing and sealing said article;
   f) heating said article to a temperature below the sintering temperature for either said first powder metal material or said second powder metal material for sufficient time to have uniform temperature throughout the article;
   g) immediately extruding said heated article through a die having a reduction ratio of at least 8 to 1 with an extrusion ram speed of at least 1 foot per minute thereby yielding a fully dense composite material with excellent combined thermal expansion and conductivity properties; and
   h) preferentially etching the surface of the fully dense composite material to remove only one of the first powder metal material or the second powder metal material thereby yielding a porous surface to enhance bonding characteristics.

9. The method of claim 6 wherein said container holding said first and said second powder metal material is made from a material having a high thermal conductivity and after being subjected to extrusion forms an at least partial surface coating for the composite material.

10. The method of claim 6 wherein said step of hot vacuum degassing and sealing of said compacted article yields a vacuum level of about at least $10^{-4}$ Torr.

11. A thermal management composite material which is the product of the process comprising the steps of:
   a) providing a first powder metal material of a low coefficient of thermal expansion;
   b) providing a second powder metal material of a high thermal conductivity;
   c) mixing said first powder metal with said second powder metal;
   d) packing said mixture into an article;

e) heating said article to a temperature below the sintering temperature for either said first powder metal material or said second powder metal material for sufficient time to have uniform temperature throughout the article; and f) immediately subjecting said heated article to extrusion through a die having an area reduction ratio of at least 8 to 1 so as to impart a true strain to said compacted article of greater than 1.75 thereby yielding a fully dense composite material with excellent combined thermal expansion and conductivity properties.

12. The thermal management composite material of claim 11 further including the step of hot vacuum degassing and sealing said compacted article to a vacuum level of about at least $10^{-4}$ Torr prior to heating said article to a temperature below the sintering temperature of either said first powder metal material or said second powder metal material.

13. The thermal management composite material of claim 11 in which mixing said first powder material and said second powder metal is done in a container made from a material having a high thermal conductivity and after being subjected to extrusion forms an at least partial surface coating for the composite material.

* * * * *